United States Patent
Kifune (10) Patent No.: US 11,150,813 B2
(45) Date of Patent: Oct. 19, 2021

(54) MEMORY SYSTEM

(71) Applicant: Toshiba Memory Corporation, Tokyo (JP)

(72) Inventor: Naoko Kifune, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/289,332

(22) Filed: Feb. 28, 2019

(65) Prior Publication Data
US 2020/0089417 A1 Mar. 19, 2020

(30) Foreign Application Priority Data
Sep. 18, 2018 (JP) .............................. JP2018-173697

(51) Int. Cl.
| | |
|---|---|
| G06F 3/06 | (2006.01) |
| G06F 11/07 | (2006.01) |
| G11C 29/52 | (2006.01) |
| H03M 13/03 | (2006.01) |

(52) U.S. Cl.
CPC .......... *G06F 3/0619* (2013.01); *G06F 3/0658* (2013.01); *G06F 3/0679* (2013.01); *G06F 11/0793* (2013.01); *G11C 29/52* (2013.01); *H03M 13/03* (2013.01)

(58) Field of Classification Search
CPC .. G06F 3/0619; G06F 11/0793; G06F 3/0679; G06F 3/0658; G06F 11/1012; G11C 29/52; G11C 2029/0409; G11C 2029/0411; H03M 13/03

USPC ......................................................... 714/764
See application file for complete search history.

(56) References Cited

U.S. PATENT DOCUMENTS

| | | | |
|---|---|---|---|
| 5,757,824 A | 5/1998 | Arai et al. | |
| 9,184,767 B2* | 11/2015 | Vernon | H03M 13/1108 |
| 9,235,488 B2* | 1/2016 | Norrie | G06F 11/2215 |
| 2005/0055622 A1 | 3/2005 | Tsukamizu | |
| 2015/0046771 A1* | 2/2015 | Kim | H03M 13/17 |
| | | | 714/764 |

FOREIGN PATENT DOCUMENTS

JP 2015215934 A 12/2015

* cited by examiner

*Primary Examiner* — James C Kerveros
(74) *Attorney, Agent, or Firm* — Kim & Stewart LLP (57) ABSTRACT

A memory system includes a non-volatile memory and a memory controller. During a read operation to read data stored in the non-volatile memory as an N-dimensional error correction code, where N is two or more, the memory controller performs an error correction process on the N-dimensional error correction code iteratively, the error correction process including a first decoding process on a first decoding input to produce a first decoding output and a second decoding process on a second decoding input to produce a second decoding output. During the error correction process, upon determining that errors remaining in the second decoding output after a most recent iteration would not be correctable, the memory controller performs a next iteration using a first decoding input for the next iteration, which is a modified form of the second decoding output of the most recent iteration.

12 Claims, 6 Drawing Sheets

|   |                    | 1 | 2 | 3 | 4 | 5 | 6 | 7 |
|---|--------------------|---|---|---|---|---|---|---|
| 1 | DECODING D1 INPUT  | 0 | 0 | 0 | 0 | 0 | 0 | 0 |
| 2 | DECODING D1 OUTPUT | 0 | 0 | 0 | 1 | 1 | 1 | 1 |
| 3 | DECODING D2 INPUT  | 0 | 0 | 0 | 1 | 1 | 1 | 1 |
| 4 | DECODING D2 OUTPUT | 0 | 1 | 1 | 0 | 0 | 1 | 1 |
| 5 | DECODING D1 INPUT  | 0 | 1 | 1 | 0 | 0 | 0 | 0 |
| 6 | DECODING D1 OUTPUT | 0 | 0 | 1 | 0 | 1 | 0 | 1 |
| 7 | DECODING D2 INPUT  | 0 | 0 | 0 | 1 | 1 | 0 | 1 |

MEMORY SYSTEM

CROSS-REFERENCE TO RELATED APPLICATIONS

This application is based upon and claims the benefit of priority from Japanese Patent Application No. 2018-173697, filed Sep. 18, 2018, the entire contents of which are incorporated herein by reference.

FIELD

Embodiments described herein relate generally to a memory system.

BACKGROUND

In a memory system, to protect stored data, data on which error correction encoding has been performed is stored. Therefore, when reading the data stored in the memory system, decoding is performed on the data on which error correction encoding has been performed.

DETAILED DESCRIPTION

Embodiments provide a memory system capable of executing error correction with higher accuracy.

In general, according to one embodiment, a memory system includes a non-volatile memory and a memory controller configured to control read and write operations on the non-volatile memory. During a read operation to read data that is stored in the non-volatile memory as an N-dimensional error correction code, where N is greater than or equal to two, the memory controller performs an error correction process on the N-dimensional error correction code in an iterative manner until the error correction process is successful, the error correction process including a first decoding process on a first decoding input to produce a first decoding output and a second decoding process on a second decoding input to produce a second decoding output. During the error correction process, upon determining that errors remaining in the second decoding output after a most recent iteration of the error correction process would not be correctable in one or more subsequent iterations of the error correction process, the memory controller performs a next iteration of the error correction process using a first decoding input for the next iteration, which is a modified form of the second decoding output of the most recent iteration of the error correction process.

Hereinafter, a memory system according to an embodiment will be described in detail with reference to the attached drawings. The present disclosure is not limited to the following embodiment.

Figure 1:
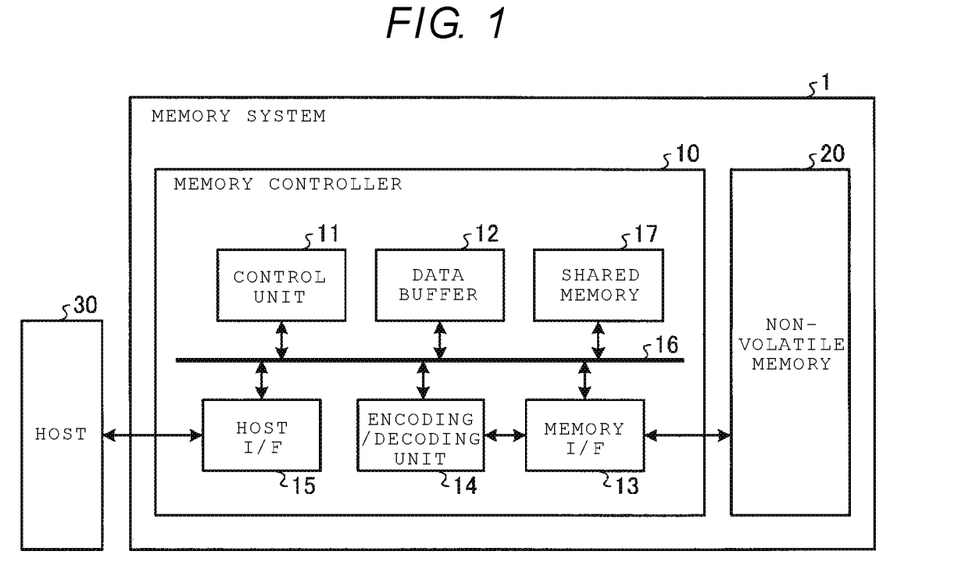
FIG. 1 is a block diagram of a memory system according to an embodiment.

FIG. 1 is a block diagram of a memory system according to an embodiment. As illustrated in FIG. 1, a memory system 1 includes a memory controller 10 and a non-volatile memory 20. The memory system 1 can be connected to a host 30 and FIG. 1 illustrates a state in which the memory system 1 is connected to the host 30. For example, the host 30 may be an electronic device such as a personal computer and a mobile terminal.

The non-volatile memory 20 is a non-volatile memory which stores data in a non-volatile manner, and is for example, a NAND type flash memory (hereinafter, simply referred to as a NAND memory). In the following description, a case where a NAND memory is used as the non-volatile memory 20 is illustrated as an example. As the non-volatile memory 20, storage devices such as a three-dimensional structure flash memory, a resistance random access memory (ReRAM), or a ferroelectric random access memory (FeRAM), other than the NAND memory, may be used. The non-volatile memory 20 is not necessarily a semiconductor memory and the embodiment can be applied to various storage media other than a semiconductor memory.

The memory system 1 may be a memory card or the like in which the memory controller 10 and the non-volatile memory 20 are configured as one package or may be a solid state drive (SSD).

For example, the memory controller 10 is a semiconductor integrated circuit configured as a system-on-a-chip (SoC) type device. Some or all operations of each component of the memory controller 10 described below may be performed by executing firmware in a central processing unit (CPU) or may be performed in hardware.

The memory controller 10 controls writing in the non-volatile memory 20 according to a write request from the host 30. The memory controller 10 controls reading from the non-volatile memory 20 according to a read request from the host 30. The memory controller 10 includes a host I/F (host interface) 15, a memory I/F (memory interface) 13, a control unit 11, an encoding/decoding unit (codec) 14, a data buffer 12, and a shared memory 17. The host I/F 15, the memory I/F 13, the control unit 11, the encoding/decoding unit 14, the data buffer 12, and the shared memory 17 are connected to each other via an internal bus 16.

The host I/F 15 performs a process according to an interface specification shared with the host 30, and outputs a request, user data to be written, and the like received from the host 30 to the internal bus 16. The host I/F 15 transmits the user data read from the non-volatile memory 20 and restored, a response from the control unit 11, and the like to the host 30.

The memory I/F 13 performs a write process in the non-volatile memory 20 based on an instruction of the control unit 11. The memory I/F 13 performs a read process from the non-volatile memory 20 based on an instruction of the control unit 11.

The data buffer 12 temporarily stores the user data received from the host 30 until the memory controller 10 stores the received user data in the non-volatile memory 20.

The data buffer 12 temporarily stores the user data read from the non-volatile memory 20 until the user data is transmitted to the host 30. As the data buffer 12, a general purpose memory, for example, a static random access memory (SRAM), a dynamic random access memory (DRAM), or the like may be used.

The control unit 11 comprehensively controls each component of the memory system 1. When a request is received from the host 30 via the host I/F 15, the control unit 11 performs control according to the request. For example, the control unit 11 instructs the memory I/F 13 to write user data and parity in the non-volatile memory 20 according to the write request from the host 30. The control unit 11 instructs the memory I/F 13 to read the user data and the parity from the non-volatile memory 20 according to the read request from the host 30.

When the write request of the user data is received from the host 30, the control unit 11 determines a storage area in the non-volatile memory 20 for the user data to be accumulated in the data buffer 12. That is, the control unit 11 manages a write destination of the user data. The correspondence between a logical address of the user data received from the host 30 and a physical address that indicates the storage area in the non-volatile memory 20 in which the user data is stored is stored in an address conversion table.

When the read request is received from the host 30, the control unit 11 converts the logical address designated by the read request into the physical address using the above-described address conversion table, and instructs the memory I/F 13 to perform data reading from the physical address.

Here, in the NAND memory, writing and reading are performed in a data unit called a page and erasing is performed in a data unit called a block. In the embodiment, a plurality of memory cells connected to a same word line is called a memory cell group. When the memory cell is a single level cell (SLC), one memory cell group corresponds to one page. When the memory cell is a multi-level cell (MLC), one memory cell group corresponds to a plurality of pages. Each memory cell is connected to a word line and also connected to a bit line. Accordingly, each memory cell can be identified by an address for identifying the word line and an address for identifying the bit line.

The user data received from the host 30 is transferred to the internal bus 16 and temporarily stored in the data buffer 12. The encoding/decoding unit 14 encodes the user data stored in the non-volatile memory 20 to generate coded data (referred to herein as a code word). The encoding/decoding unit 14 decodes the encoded data (also referred to as read information or received word) read from the non-volatile memory 20 and restores the user data. The data encoded by the encoding/decoding unit 14 may include control data and the like used inside the memory controller 10 in addition to the user data.

In the write process in the memory system 1 of the above configuration, when the user data is written in the non-volatile memory 20, the control unit 11 instructs the encoding/decoding unit 14 to encode the user data. Here, the control unit 11 determines a storage location (in particular, storage address) of a code word in the non-volatile memory 20 and also instructs the memory I/F 13 to write to the determined storage location. The encoding/decoding unit 14 encodes the user data on the data buffer 12 based on an instruction from the control unit 11 and generates a code word. As the encoding method, for example, a method using low-density parity-check (LDPC) encoding, Bose-Chaudhuri-Hocquenghem (BCH) encoding, or Reed-Solomon (RS) encoding may be adopted.

On the other hand, in the reading process, when the user data is read from the non-volatile memory 20, the control unit 11 designates an address in the non-volatile memory 20 and instructs the memory I/F 13 to perform reading from that address. The control unit 11 instructs the encoding/decoding unit 14 to start decoding. The memory I/F 13 performs reading of data from the designated address of the non-volatile memory 20 according to the instruction of the control unit 11, and inputs the read information obtained by this reading to the encoding/decoding unit 14. Then, the encoding/decoding unit 14 decodes the input read information.

The encoding/decoding unit 14 may also be used as an encoder/decoder for each component code of a multidimensional error correction code. The multidimensional error correction code refers to a symbol in which at least one or more constituent units of the error correction code are protected in a multiplexed manner by a plurality of smaller component codes. In this case, for example, one symbol include one bit (an element of a binary field) or an alphabet element of a finite field other than a binary field.

Figure 2:
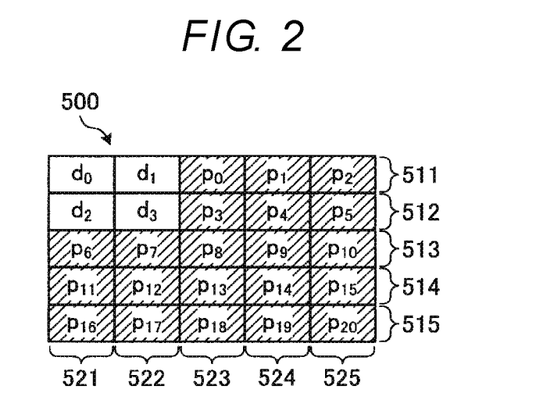
FIG. 2 is a diagram illustrating an example of a multidimensional error correction code employed in the embodiment.

Here, as an example of a multidimensional error correction code, a product code is illustrated in FIG. 2. A product code 500 illustrated in FIG. 2 has a structure in which each information bit (which may be symbols) $d_0$ to $d_3$ has an information length of two bits in a row direction (lateral direction in the drawing) and in a column direction (vertical direction in the drawing), and is protected by Hamming codes 511 to 515 and 521 to 525 of an information length of three bits. With such a product code 500, all information bits $d_0$ to $d_3$ and parity bits $p_0$ to $p_{20}$ are doubly protected by the Hamming codes in the row direction (also referred to as dimension 1) and in the column direction (also referred to as dimension 2).

The multidimensional error correction code is not limited to the product code 500 exemplified in FIG. 2, and a generalized low density parity check code (generalized LDPC code), or the like may be used. In a general multidimensional error correction code including the generalized LDPC code, a multiple degree of protection may be different for each symbol. In the general multidimensional error correction code, component codes cannot be grouped into, for example, dimension 1 and dimension 2, but the technology can be applied to a multidimensional error correction code having such a code structure.

With the product code as illustrated in FIG. 2, for example, a decoding process including decoding by dimension 1 and decoding by dimension 2 is repeatedly executed. The product code is used to realize an encoding method with a high correction capability and a small calculation amount. Most of error correction codes used in product codes are linear codes. This is because excellent code construction method and decoding method are known. With linear codes, errors can be correctly detected when there are errors the number of which is equal to or less than the number of correctable errors, within the correctable range of code length. On the other hand, when there are errors the number of which is more than the number of correctable errors within the code length, it may not be possible to specify an error location or it may be possible to erroneously detect the error location. When the error location is erroneously detected, there is a possibility that the wrong location is corrected.

With the product code, correction cannot proceed when errors are concentrated in a specific region in some cases.

For example, when correction proceeds while overwriting the decoding result by multiple error correction codes combined with the product code, if more errors than the number of correctable errors are included in a range correctable by an error correction code of any dimension, erroneous correction is performed and the result of erroneous correction is overwritten in some cases. As a result, errors are concentrated in a specific area and correction cannot proceed.

In the embodiment, decoding does not proceed by overwriting the decoding result by the error correction code of each dimension, and the respective decoding results of the error correction code of each dimension are stored in mutually different storage areas. Then, the input data when the error correction code of a certain dimension is decoded is set as data in which the previous correction result of the error correction code is not reflected and only the decoding result of the error correction code of another dimension is reflected. Thus, it is possible to prevent insertion of errors due to erroneous correction and thus improve correction ability. The error correction code of each dimension is also referred to as the component code of each dimension.

Figure 3:
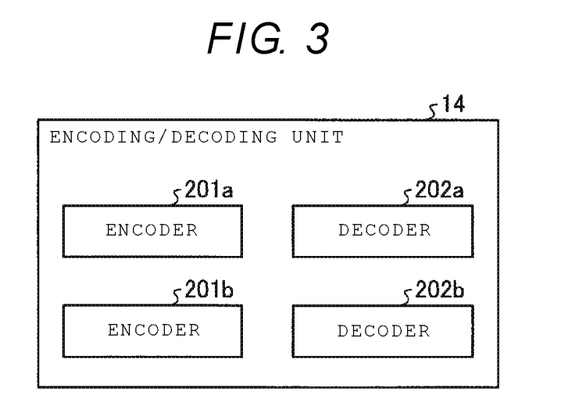
FIG. 3 is a block diagram illustrating functional components of an encoding/decoding unit.

FIG. 3 is a block diagram illustrating functional components of the encoding/decoding unit 14. FIG. 3 illustrates an example of the encoding/decoding unit 14 that performs encoding/decoding of a two-dimensional product code illustrated in FIG. 2. In the following description, mainly, a two-dimensional error correction code is described as an example. The same method can be applied to an N-dimensional (N is an integer of 2 or greater) error correction code. For example, the encoding/decoding unit 14 is configured such that after a decoding process for a k-dimensional (k is an integer of 1 or greater and (N−1) or less) error correction code, a decoding process for a (k+1)-dimensional error correction code is executed.

As illustrated in FIG. 3, the encoding/decoding unit 14 includes encoders 201a and 201b, and decoders 202a and 202b. The encoders 201a and 201b respectively encode component codes of dimension 1 and dimension 2. The decoders 202a and 202b respectively decode component codes of dimension 1 and dimension 2.

The shared memory 17 in FIG. 1 stores data that is referred to in encoding by the encoders 201a and 201b and decoding by the decoders 202a and 202b. For example, the shared memory 17 respectively stores input data used when an n-dimensional (n is an integer of 1 or greater and N or less) error correction code is decoded in an m-th (m is an integer of 1 or greater) decoding process by the decoders 202a and 202b. The shared memory 17 respectively stores output data which is a result of the n-dimensional error correction code in the m-th decoding process. The shared memory 17 may be provided in the encoding/decoding unit 14.

The decoding process may include hard bit decoding (e.g., hard decision decoding) and soft bit decoding (e.g., soft decision decoding). In the hard bit decoding, one bit (hard bit) of 0 or 1 is used as input data. In the soft bit decoding, likelihood information (soft bit), such as a log likehood ratio (LLR) representing likelihood of 0 or 1, is further used as input data.

The decoders 202a and 202b may be decoders that input hard bits as input data and output hard bits as output data, or may be decoders that input hard bits and soft bits as input data and output hard bits as output data.

Figure 4:
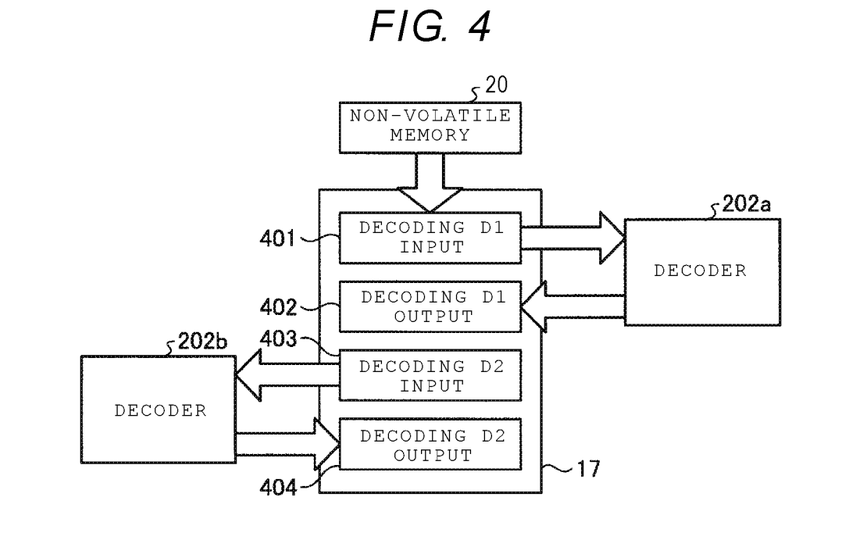
FIG. 4 is a diagram for explaining an iterative decoding process according to the embodiment.

FIG. 4 is a diagram for explaining an outline of an iterative decoding process according to the embodiment. The iterative decoding process is a process of repeating the decoding process by the decoders 202a and 202b. Data to be decoded which is input from the non-volatile memory 20 via the memory I/F 13, is stored in the shared memory 17. The decoders 202a and 202b can access the shared memory 17, respectively. The data to be decoded is stored in a storage area 401 of the shared memory 17, for example.

Hereinafter, the decoding by the decoder 202a is referred as decoding D1, the input data of the decoding D1 is referred as decoding D1 input, and the output data of the decoding D1 is referred as decoding D1 output. Similarly, the decoding by the decoder 202b is referred as decoding D2, the input data of the decoding D2 is referred as decoding D2 input, and the output data of the decoding D2 is referred as decoding D2 output.

When the decoding process starts, the decoder 202a inputs the data to be decoded stored in the storage area 401 of the shared memory 17, and decodes the input data (decoding D1 input). In this manner, in the decoding D1 in the first decoding process, the data to be decoded is input data. The decoder 202a stores the decoding result (decoding D1 output) in a storage area 402 of the shared memory 17.

The decoder 202b inputs the data generated with reference to the decoding result of the decoder 202a or the like and decodes the input data (decoding D2 input). The decoding D2 input is generated with reference to the data stored in the shared memory 17 (decoding D1 output, decoding D2 input, and decoding D2 output). The generated data is input simultaneously while decoding by the decoder 202b occurs, and stored in a storage area 403. Details of method of generating the decoding D2 input will be described later. In first decoding D2, the decoding D1 output is directly reflected on the decoding D2 input. The decoder 202b stores the decoding result (decoding D2 output) in a storage area 404 of the shared memory 17.

In second and subsequent decoding processes, the decoder 202a inputs the data generated with reference to the decoding result of the decoder 202b or the like and decodes the input data (decoding D1 input). The decoding D1 input is generated with reference to the data (decoding D2 output, decoding D1 input, and decoding D1 output) stored in the shared memory 17. The generated data is input simultaneously while decoding by the decoder 202a occurs and is stored in the storage area 401. Details of method of generating the decoding D1 input will be described later. The decoder 202a stores the decoding result (decoding D1 output) in the storage area 402 of the shared memory 17.

Figure 5:
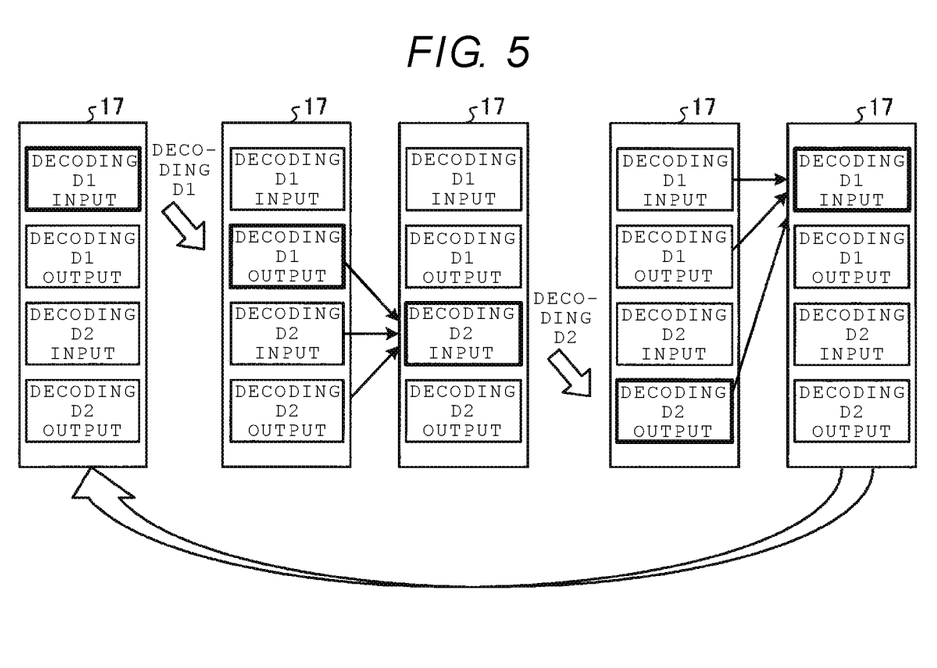
FIG. 5 is a diagram illustrating a relationship of data stored in a shared memory.

FIG. 5 is a diagram illustrating a relationship of data stored in the shared memory 17. The decoder 202a executes the decoding D1 using the decoding D1 input and stores the decoding D1 output as the decoding result of the decoding D1 in the shared memory 17. The decoding D2 input used in the decoding D2 is generated with reference to each piece of data stored in the shared memory 17. The decoder 202b executes the decoding D2 using the decoding D2 input and stores the decoding D2 output as the decoding result of the decoding D2 in the shared memory 17. The decoding D1 input used in the next decoding D1 is generated with reference to each piece of data stored in the shared memory 17.

The above process is repeatedly executed, for example, up to an upper limit of the number of times of repeat (M times, M is an integer of 2 or more) or until there is no error in the user data.

The decoders 202a and 202b may store the decoding result in the shared memory 17 as it is or may store an error vector obtained from the decoding result or a syndrome corresponding to the error vector. The error vector is, for example, a binary vector in which only the position specified as including an error is set to 1. The error vector and the syndrome can be used to determine whether or not correction is performed and to restore the decoding result. That is, the error vector and the syndrome are information equivalent to the decoding result.

Next, the detailed description of the method of generating the input data (decoding D1 input and decoding D2 input) will be given.

In the (m+1)-th decoding process for the n-dimensional component code, input data in which a bit value corrected by decoding with the n-dimensional error correction code without being corrected by decoding with the error correction code of another dimension other than the n-dimension is changed to a bit value corresponding to the input data used in the m-th decoding process (equivalent to a bit value before correction) is used in the m-th decoding process. In the m-th decoding process, the bit value corrected by decoding with the error correction code of another dimension other than the n-dimension is not changed and is used as it is in the (m+1)-th decoding process.

More specifically, each bit of the input data (decoding D1 input) used in the decoding D1 in the (m+1)-th decoding process is generated by sequentially determining the following conditions (C1), (C2), and (C3). Each condition is determined for each bit.
(C1) When corrected by m-th decoding D2, that is, when m-th decoding D2 input≠m-th decoding D2 output: (m+1)-th decoding D1 input=m-th decoding D2 output
(C2) When corrected by m-th decoding D1, that is, when m-th decoding D1 input≠m-th decoding D1 output: (m+1)-th decoding D1 input=m-th decoding D1 input
(C3) In cases other than the above cases, that is, when not corrected by any of m-th decoding D1 and m-th decoding D2: (m+1)-th decoding D1 input=m-th decoding D2 output Each bit of the input data (decoding D2 input) used in the decoding D2 in the (m+1)-th decoding process is generated by sequentially determining the following conditions (C4), (C5), and (C6). Each condition is determined for each bit.
(C4) When corrected by (m+1)-th decoding D1, that is, when (m+1)-th decoding D1 input (m+1)-th decoding D1 output: (m+1)-th decoding D2 input=(m+1)-th decoding D1 output.
(C5) When corrected by m-th decoding D2, that is, when m-th decoding D2 input=m-th decoding D2 output: (m+1)-th decoding D2 input=m-th decoding D2 input.
(C6) In cases other than the above cases, that is, when not corrected by any of (m+1)-th decoding D1 and m-th decoding D2: (m+1)-th decoding D2 input=(m+1)-th decoding D1 output.

The function of generating input data according to the above conditions from the data of the shared memory 17 may be realized by a combinational circuit and the like, or may be realized by causing a processor such as the CPU to execute a program, that is, be realized by software.

Figure 6:
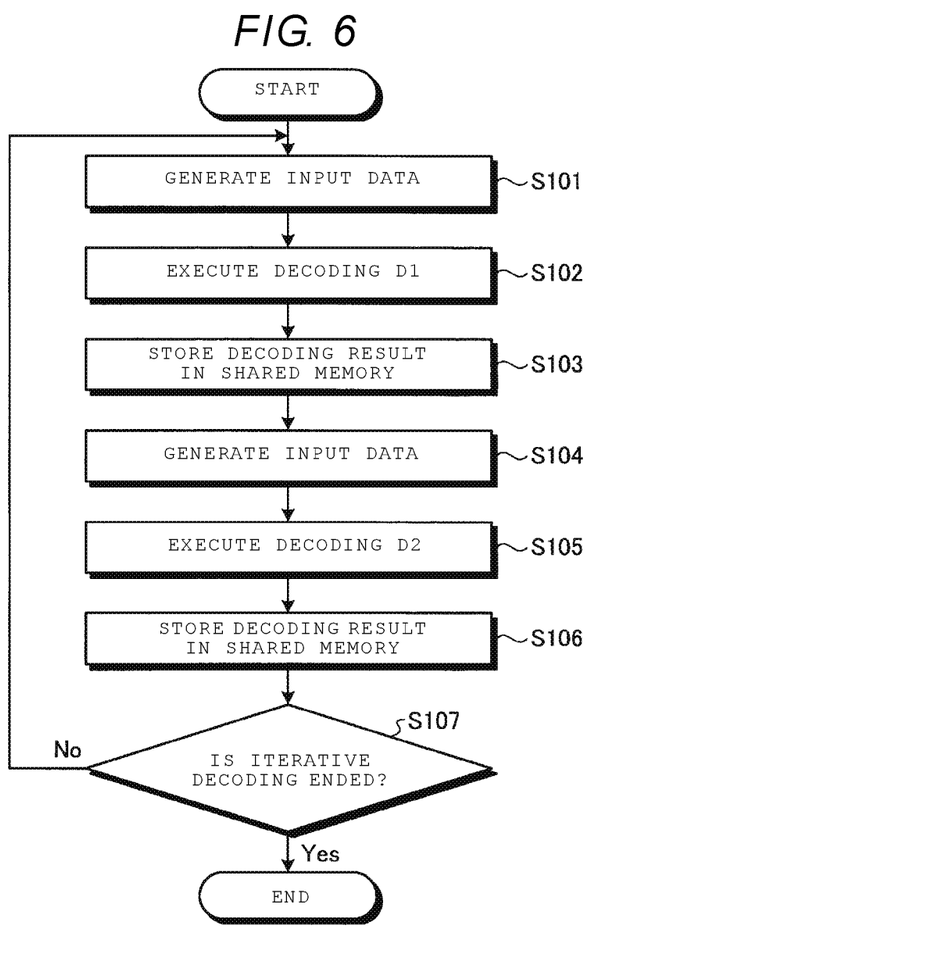
FIG. 6 is a flowchart illustrating an iterative decoding process according to the embodiment.

Next, a flow of an iterative decoding process by the memory system 1 according to the embodiment thus configured will be described. FIG. 6 is a flowchart illustrating an example of an iterative decoding process according to the embodiment.

The decoder 202a generates the input data to use for the decoding D1 (step S101). As described above, in the first decoding process, the data stored in the storage area 401 of the shared memory 17 becomes the input data. In the second and subsequent decoding processes, the decoder 202a generates each bit of the input data according to the above conditions (C1) to (C3).

The decoder 202a executes the decoding D1 on the input data (step S102). The decoder 202a stores the decoding D1 output which is the result of the decoding D1 in the storage area 402 of the shared memory 17 (step S103).

The decoder 202b generates the input data to use for the decoding D2 (step S104). As described above, in the first decoding process, the decoding D1 output, which is the first decoding result of the decoding D1, becomes the input data. In the second and subsequent decoding processes, the decoder 202b generates each bit of the input data according to the above conditions (C4) to (C6).

The decoder 202b executes the decoding D2 on the input data (step S105). The decoder 202b stores the decoding D2 output as the result of the decoding D2 in the storage area 404 of the shared memory 17 (step S106).

The encoding/decoding unit 14 determines whether to end the iterative decoding (step S107). For example, when decoding of the error correction code is successful, or when decoding of the error correction code fails but the number of times of iterative decoding reaches the preset upper limit number (M times), the encoding/decoding unit 14 determines to end the iterative decoding. For example, when decoding of the error correction code fails and the number of times of iterative decoding did not reach the upper limit, the encoding/decoding unit 14 determines not to end the iterative decoding. When it is determined not to end the iterative decoding (step S107: No), the process returns to step S101 and the process is repeated. When it is determined to end the iterative decoding (step S107: Yes), the encoding/decoding unit 14 ends the iterative decoding process.

Figure 7:
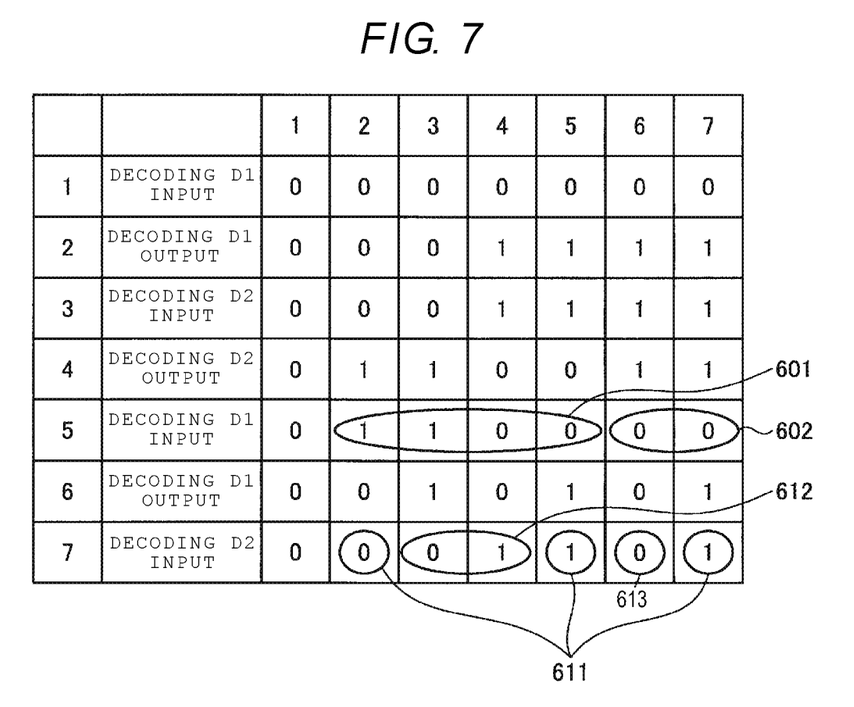
FIG. 7 is a diagram illustrating examples of transition of input data and output data of the iterative decoding process.

Next, a specific example of the iterative decoding process according to the embodiment will be described. FIG. 7 is a diagram illustrating examples of transition of input data and output data of the iterative decoding process. Each example in FIG. 7 corresponds to an example of seven bits. Numerical values from 1 to 7 represent indices for identifying bits. Each row in FIG. 7 represents a change in chronological order of input data and output data.

For example, a first row and a second row are input data (decoding D1 input) and output data (decoding D1 output) of the first decoding D1, respectively. A third row and a fourth row are input data (decoding D2 input) and output data (decoding D2 output) of the first decoding D2, respectively. A fifth row and a sixth row are input data (decoding D1 input) and output data (decoding D1 output) of the second decoding D1, respectively. A seventh row is input data (decoding D2 input) of the second decoding D2.

In the first example, it is assumed that for the bits of indices 6 and 7, the first decoding D1 (the decoding D1 output in the second row) is erroneous correction. It is also assumed that the erroneous correction cannot be restored by the first decoding D2 (decoding D2 output in the fourth row). Even in such a case, according to the embodiment, input data 602 of the decoding D1 in the fifth row is returned to the decoding D1 input in the first row. In the second decoding D1, there is a possibility that erroneous correction may be performed again like the bit of index 7. On the other hand, after the first decoding D2, when the error of the bit in an area to be protected of the decoding D1 is decreased, a possibility of performing correct correction like the decoding result of the second decoding D1 of the bit of index 6 (the decoding D1 output in the sixth row) is increased.

In the second example, it is assumed that for the bits of indices 6 and 7, the first decoding D1 (the decoding D1 output in the second row) is correct correction. It is also assumed that the same value is output in the first decoding D2 (the decoding D2 output in the fourth row). In such a case, according to the embodiment, the input data 602 of the decoding D1 in the fifth row is returned to the input data before correction (the decoding D1 input in the first row). However, as long as the erroneous correction is not applied to the area to be protected of the decoding D1 by a certain amount or greater, the correct correction is performed again like the decoding D1 output of the sixth row of the bit of the index 7.

Input data 601 in FIG. 7 illustrates an example of data in which the decoding D2 output is used as the next decoding D1 input since the data is corrected by the decoding D2 (the above (C1)). The input data 602 illustrates an example of data in which the previous decoding D1 input is used as the decoding D1 input since the data is not corrected by the decoding D2 but corrected by the decoding D1 (the above (C2)). Input data 611 illustrates an example of data in which the decoding D1 output is used as the next decoding D2 input since the data is corrected by the decoding D1 (the above (C4)). Input data 612 illustrates an example of data in which the previous decoding D2 input is used as the decoding D2 input since the data is not corrected by the decoding D1 but corrected by the decoding D2 (the above (C5)). The bits of index 1 correspond to bits that are not corrected in either the decoding D1 or the decoding D2 (the above (C3) and (C6)).

FIG. 7 illustrates an example in which there is no change in the bit value in the sixth column between input and output of the previous D2 decoding and between input and output of the latest D1 decoding, but the bit value during the previous D2 decoding and the bit value during the latest D1 decoding are different. In FIG. 7, the bit value during the latest D1 decoding is used as the value of bit 613 (the seventh row and the sixth column in FIG. 7) for the next D2 decoding as an example; however, the bit value during the previous D2 decoding can also be used as the bit 613. In such a case, the bit value is corrected during the first D1 decoding (the first row and the second row of the sixth column in FIG. 7) but is not corrected during the D2 decoding (the third row and the fourth row of the sixth column in FIG. 7) and during the second D1 decoding (the fifth row and the sixth row of the sixth column in FIG. 7). Basically, it is preferable to use the bit value during the D2 decoding if the error correction ability of D2 decoding is low, or to use the bit value during the second D1 decoding if the error correction ability of D1 decoding is low.

In a configuration in which the first decoding D1 (the decoding D1 output in the second row) is erroneous correction and the input data is overwritten, when t+1 or more errors (t is the number of error correctable bits) remain in the code word that is error-corrected by the decoding D1 even after the next decoding D2, the error is corrected again by the decoding D1.

In contrast, according to the embodiment, each decoder (the decoders 202a and 202b) can return the corrected location to the original value and perform decoding. Therefore, even when errors are corrected by the error correction code of a certain dimension, as long as a majority of bits are correctly corrected by the error correction code of another dimension, a possibility of converging to the correct data is increased.

Figure 8:
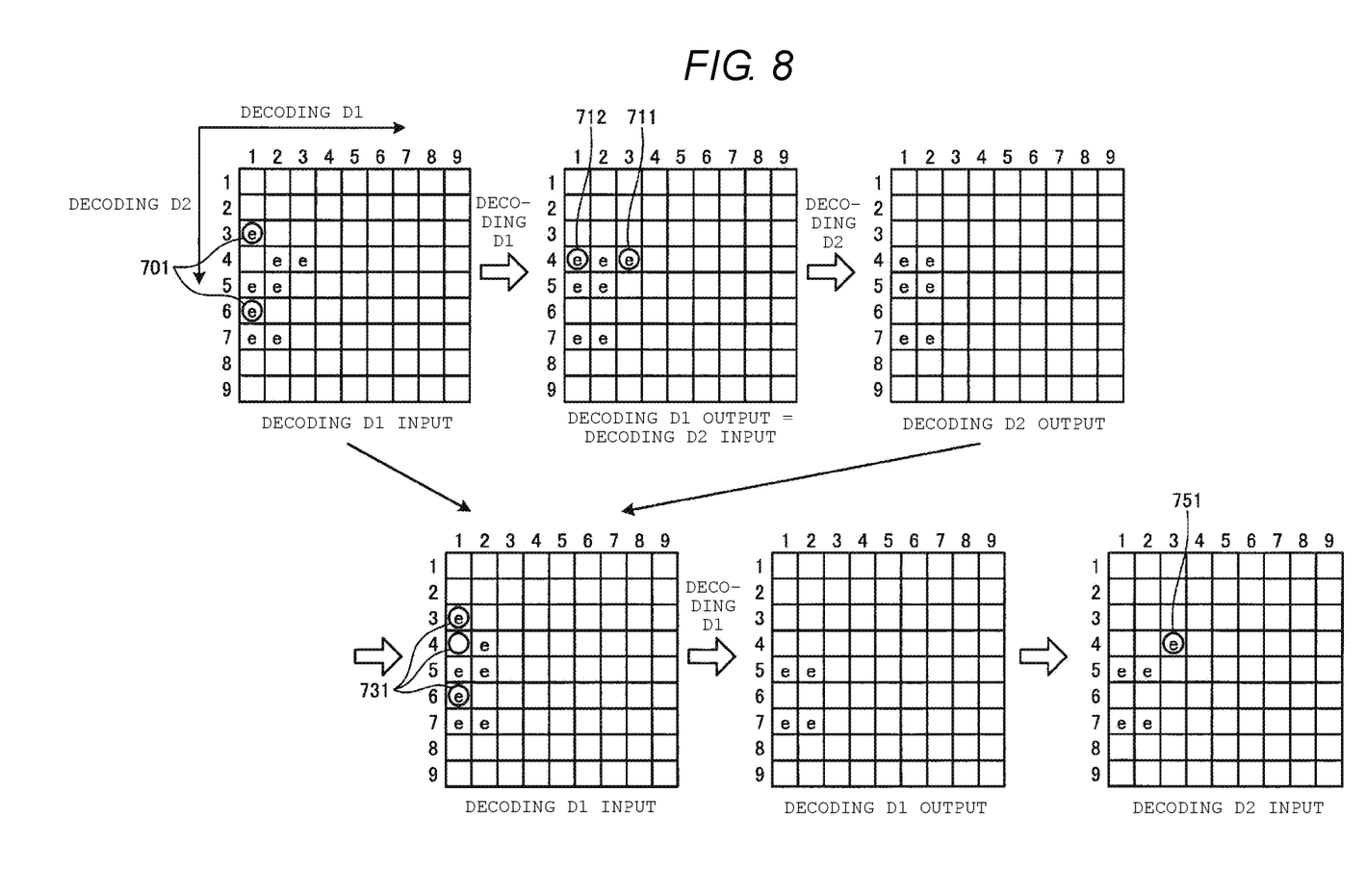
FIG. 8 is a diagram illustrating an example of transition of bits corrected by a two-dimensional error correction code.

FIG. 8 is a diagram illustrating an example of transition of bits corrected by a two-dimensional error correction code. FIG. 8 illustrates an example in which nine bits in the row direction are protected by the error correction code of dimension 1 and nine bits in the column direction are protected by the error correction code of dimension 2. In the drawing, "e" represents a bit in which an error is generated.

In the example illustrated in FIG. 8, it is assumed that the number of bits that can be corrected by the error correction code of dimension 1 is 1 and the number of bits that can be corrected by the error correction code of dimension 2 is 2.

The upper left diagram illustrates an example of input data (decoding D1 input) of the first decoding D1, for example. A bit 701 represents a bit to be corrected in the first decoding D1.

The upper middle diagram illustrates the decoding result (decoding D1 output) of the first decoding D1 and also illustrates the input data (decoding D2 input) of the first decoding D2. As illustrated in the drawing, the error of the bit 701 is corrected. A bit 712 represents a bit erroneously corrected by the decoding D1. A bit 711 represents a bit to be corrected in the first decoding D2.

The upper right diagram illustrates the decoding result (decoding D2 output) of the first decoding D2. As illustrated in the drawing, the error of the bit 711 is corrected.

When the embodiment is not applied, in the state illustrated in the upper right diagram, the number of correctable bits that can be corrected by the error correction code of dimension 1 and dimension 2 respectively is exceeded. Thus, correction does not proceed even when error correction codes of dimension 1 and dimension 2 are used. As described above, in the multi-dimensional error correction code to which the embodiment is not applied, correction may not proceed when there are errors concentrated in a specific area. In contrast, according to the embodiment, even when errors are concentrated in a specific area due to erroneous correction, the input data can be decoded by being returned to the data before the previous correction. Therefore, it is possible to reduce the influence of erroneous correction and to improve the correction ability.

For example, the lower left diagram illustrates an example of input data (decoding D1 input) of the second decoding D1. Each bit 731 represents a bit corrected by the first decoding D1 and returned to the value before correction.

The lower middle diagram illustrates the decoding result (decoding D1 output) of the second decoding D1. Since input data different from the first decoding D1 input (upper left diagram) is input, output data different from the first decoding D1 output (upper center diagram), that is, output data with less erroneous bits is output.

The lower right diagram illustrates the input data (decoding D2 input) of the second decoding D2. A bit 751 represents a bit corrected by the first decoding D2 and returned to the value before correction. Even when the value is returned as described above, the bit is correctly corrected by the decoding D1 which is the decoding of another dimension. Thus, the number of errors is equal to or less than the number of errors that can be corrected by the error correction code of dimension 2 and the correction by the second decoding D2 can proceed.

Figure 9:
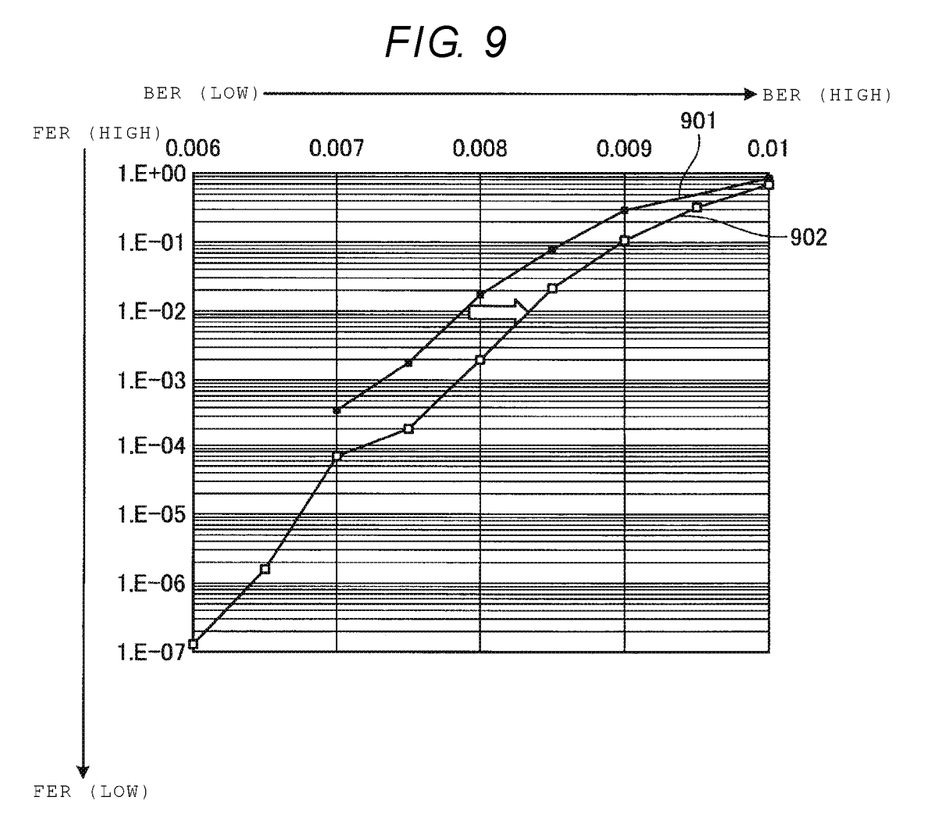
FIG. 9 is a diagram illustrating an improvement in the error correction accuracy in the embodiment.

FIG. 9 is a diagram illustrating an example of an effect of improving the error correction accuracy according to the embodiment. FIG. 9 illustrates results of decoding the error correction codes with coding rates of 0.98 and 0.9 as decoding D1 and D2, respectively. The horizontal axis of the graph of FIG. 9 illustrates a bit error rate (BER). In FIG. 9, the bit error rate indicates a probability (a value obtained by dividing the number of erroneous bits by the total number of bits) of a bit erroneous before decoding read from the non-volatile memory 20. The vertical axis of the graph of FIG. 9 illustrates a frame error rate (FER).

A line 901 illustrates the relationship between the frame error rate and the bit error rate according to a method of correction proceeded by overwriting decoding result by a plurality of error correction codes without applying the embodiment. A line 902 illustrates the relationship between the frame error rate and the bit error rate according to the embodiment. For example, when the frame error rate is $10^{-2}$, the bit error rate is improved by about 5% according to the embodiment compared with the system to which the embodiment is not applied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a non-volatile memory; and
    a memory controller which is configured to control a write operation on the non-volatile memory to store an error correction code in the non-volatile memory, and to control a read operation to read the error correction code from the non-volatile memory, the memory controller including first and second decoders, and a shared memory having first, second, third, and fourth locations for storing an input for the first decoder, an output for the first decoder, an input for the second decoder, and an output for second decoder, respectively, wherein
    during the read operation, the memory controller performs an error correction process on the error correction code in multiple iterations until the error correction process is successful, the error correction process of an iteration i including
        a first decoding process of the iteration i carried out by the first decoder on a first decoding input of the iteration i that is stored in the first location of the shared memory to produce a first decoding output of the iteration i, wherein the first decoding output of the iteration i is stored in the second location of the shared memory, and
        a second decoding process of the iteration i carried out by the second decoder on a second decoding input of the iteration i that is stored in the third location of the shared memory, to produce a second decoding output of the iteration i, wherein the second decoding output of the iteration i is stored in the fourth location of the shared memory, and
    during the error correction process of a next iteration j+1 that is subsequent to iteration j,
        the memory controller generates a first decoding input of the next iteration j+1 based on the second decoding output of the iteration j stored in the fourth location of the shared memory and the first decoding input of the iteration j that is stored in the first location of the shared memory, stores the first decoding input of the next iteration j+1 in the first location of the shared memory, and performs the first decoding process of the next iteration j+1 of the error correction process using the first decoding input of the next iteration j+1 stored in the first location of the shared memory, and
        the memory controller generates a second decoding input of the next iteration j+1 based on the first decoding output of the iteration j+1 stored in the second location of the shared memory and the second decoding input of the iteration j that is stored in the third location of the shared memory, stores the second decoding input of the next iteration j+1 in the third location of the shared memory, and performs the second decoding process of the next j+1 iteration of the error correction process using the second decoding input of the next iteration j+1 stored in the third location of the shared memory.

2. The memory system according to claim 1, wherein
    the first decoding input of the next iteration j+1 is the same as the second decoding output of the iteration i if no bits were corrected as a result of the first decoding process of the iteration j and different from the second decoding output of the iteration j if bits were corrected as a result of the first decoding process of the iteration j, and
    the second decoding input of the next iteration j+1 is the same as the first decoding output of the iteration j+1 if no bits were corrected as a result of the second decoding process of the iteration j and different from the first decoding output of the iteration j+1 if bits were corrected as a result of the second decoding process of the iteration j.

3. The memory system according to claim 2, wherein the first decoding input of the next iteration j+1 is different from the second decoding output of the iteration j at location of the bits that were corrected as a result of the first decoding process of the iteration j if bits were corrected as a result of the first decoding process of the iteration j.

4. The memory system according to claim 3, wherein the second decoding input of the next iteration j+1 is different from the first decoding output of the iteration j+1 at location of the bits that were corrected as a result of the second decoding process of the iteration j if bits were corrected as a result of the second decoding process of the iteration j.

5. The memory system according to claim 1, wherein a maximum number of errors correctable by the first decoding process and a maximum number of errors correctable by the second decoding process are different.

6. The memory system according to claim 5, wherein the maximum number of errors correctable by the first decoding process is one and the maximum number of errors correctable by the second decoding process is two.

7. A method of performing an error correction in a memory system comprising a non-volatile memory, in which an error correction code is stored, a memory controller including first and second decoders, and a shared memory having first, second, third, and fourth locations for storing an input for the first decoder, an output for the first decoder, an input for the second decoder, and an output for second decoder, respectively, said method comprising:
    performing an error correction process on the error correction code in multiple iterations until the error correction process is successful, the error correction process of an iteration i including
        a first decoding process of the iteration i carried out by the first decoder on a first decoding input of the iteration i that is stored in the first location of the shared memory to produce a first decoding output of the iteration i, wherein the first decoding output of the iteration i is stored in the second location of the shared memory, and
        a second decoding process of the iteration i carried out by the second decoder on a second decoding input of the iteration i that is stored in the third location of the shared memory, to produce a second decoding output of the iteration i, wherein the second decoding output of the iteration i is stored in the fourth location of the shared memory; and during the error correction process, generating a first decoding input of the iteration j+1 based on the second decoding output of the iteration j stored in the fourth location of the shared memory and the first decoding input of the iteration j that is stored in the first location of the shared memory, storing the first decoding input of the next iteration j+1 in the first location of the shared memory, and performing the first decoding process of the next iteration j+1 of the error correction process using the first decoding input of the next iteration j+1 stored in the first location of the shared memory, and generating a second decoding input of the next iteration j+1 based on the first decoding output of the iteration j+1 stored in the second location of the shared memory and the second decoding input of the iteration j that is stored in the third location of the shared memory, storing the second decoding input of the next iteration j+1 in the third location of the shared memory, and performing the second decoding process of the next j+1 iteration of the error correction process using the second decoding input of the next iteration j+1 stored in the third location of the shared memory.

8. The method according to claim 7, wherein the first decoding input of the next iteration j+1 is the same as the second decoding output of the iteration j if no bits were corrected as a result of the first decoding process of the iteration j and different from the second decoding output of the iteration j if bits were corrected as a result of the first decoding process of the iteration i, and the second decoding input of the next iteration j+1 is the same as the first decoding output of the iteration j+1 if no bits were corrected as a result of the second decoding process of the iteration j and different from the first decoding output of the iteration j+1 if bits were corrected as a result of the second decoding process of the iteration j.

9. The method according to claim 8, wherein the first decoding input of the next iteration j+1 is different from the second decoding output of the iteration j at location of the bits that were corrected as a result of the first decoding process of the iteration j if bits were corrected as a result of the first decoding process of the iteration j.

10. The method according to claim 9, wherein the second decoding input for the next iteration j+1 is different from the first decoding output of the iteration j+1 at location of the bits that were corrected as a result of the second decoding process of the iteration j if bits were corrected as a result of the second decoding process of the iteration j.

11. The method according to claim 7, wherein a maximum number of errors correctable by the first decoding process and a maximum number of errors correctable by the second decoding process are different.

12. The method according to claim 11, wherein the maximum number of errors correctable by the first decoding process is one and the maximum number of errors correctable by the second decoding process is two.

* * * * *